United States Patent
Thiagarajan

(10) Patent No.: US 9,281,832 B1
(45) Date of Patent: Mar. 8, 2016

(54) CIRCUITS AND METHODS FOR BANDWIDTH ESTIMATION OPTIMIZATION OF ANALOG TO DIGITAL CONVERTERS

(71) Applicant: Texas Instruments Incorporated, Dallas, TX (US)

(72) Inventor: Ganesan Thiagarajan, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/587,377

(22) Filed: Dec. 31, 2014

(51) Int. Cl.
*H03M 1/06* (2006.01)
*H03M 1/00* (2006.01)
*H03M 1/12* (2006.01)

(52) U.S. Cl.
CPC ............ *H03M 1/002* (2013.01); *H03M 1/0629* (2013.01); *H03M 1/129* (2013.01)

(58) Field of Classification Search
CPC .... H03M 1/002; H03M 1/129; H03M 1/0629
USPC ......................... 341/155, 120, 118
See application file for complete search history.

(56) References Cited

U.S. PATENT DOCUMENTS

| | | | |
|---|---|---|---|
| 5,625,359 A * | 4/1997 | Wilson et al. | 341/143 |
| 8,300,680 B2 * | 10/2012 | Pals et al. | 375/219 |
| 8,781,326 B2 * | 7/2014 | Hu et al. | 398/76 |
| 2006/0092056 A1 * | 5/2006 | Hilton | 341/118 |
| 2014/0247171 A1 | 9/2014 | S. et al. | |
| 2014/0247175 A1 | 9/2014 | Dasgupta et al. | |

* cited by examiner

*Primary Examiner* — Brian Young
(74) *Attorney, Agent, or Firm* — Michael J. Davis, Jr.; Frank D. Cimino

(57) ABSTRACT

A bandwidth estimator circuit for an analog to digital converter. The bandwidth estimator computes a bandwidth estimate of an analog signal and includes: an amplitude averaging block configured to determine an average change in amplitude of N samples, a delta time block configured to determine a minimum time difference; a peak voltage block configured to determine the maximum magnitude; a peak to root mean square block configured to determine a ratio of a peak voltage to the root mean square of the magnitude; a bandwidth estimator block configured to compute a product of a ratio of the average change in amplitude to the minimum time difference, multiplied by a ratio of the peak voltage to the root mean square, squared, to the peak voltage multiplied by a constant; and a parameter adjustment circuit configured to modify sampler parameters controlling an analog signal sampling rate. Methods are described.

21 Claims, 7 Drawing Sheets

CIRCUITS AND METHODS FOR BANDWIDTH ESTIMATION OPTIMIZATION OF ANALOG TO DIGITAL CONVERTERS

TECHNICAL FIELD

Aspects of the present application relate generally to the use of analog to digital converters (ADCs) and in particular to optimizing the performance of ADCs using input signal bandwidth estimation.

BACKGROUND

Aspects of this application relate in general to electronic circuitry and in particular to methods and circuitry for optimizing the performance of ADCs. Recently ADCs are increasingly used for receiving signals in highly integrated circuits, which may form a single chip solution for a particular system. These integrated circuits typically have several functional blocks which together form a complete system, and are sometimes called a "System on a Chip" or "SOC." Use of SOCs reduces the number of components, the board area, and the interconnections between packaged integrated circuits on a circuit board, thereby increasing performance and reliability and reducing the size of the components. ADCs are particularly useful on an SOC in an application that has a communication interface such as a cellphone, WiFi connected tablet, and Bluetooth connected devices such as music players and portable speakers, cameras, camcorders and the like. In addition ADCs are used for integrated circuits arranged to receive sensor data, such as SOCs for thermostats, temperature, pressure, light, motion and sound sensing, automotive applications such as airbags, anti-locking brake systems, speed controls and the like. In other applications, voice recognition is performed with the human voice as an analog input signal. As the digital processing of signals that originate as analog signals becomes increasingly pervasive, the use of ADCs also increases.

Increasingly, portable devices that are completely or partially battery powered are implemented using ADC circuitry. Examples include cellphones, wireless or WiFi connected tablets, laptop computers, PDAs and the like. The need for power efficient circuitry is therefore increasing, as the battery life between charges is affected by the power consumed by the circuitry for the various functions.

Prior known ADC circuits are designed conservatively with sufficient design margin to ensure proper operations. In designing a synchronous ADC system, "worst case" scenarios of the input signal are typically used. For example, the bandwidth for the analog input signal of an ADC is assumed to be the maximum bandwidth of all possible input signals. The sampling rate in a synchronous ADC is then designed to meet or exceed the Nyquist rate, which is at least 2× the maximum frequency of the input signal. However, in practice the input signal may have a much different bandwidth at different time instants. Many input signals have long periods of relatively low frequency, followed by short periods of higher frequency signaling due to a change in environmental factors. Examples include human speech, which has greatly varying frequency content, and FM signals, which have a frequency content that varies greatly with baseband signal strength. Other systems include sensors which may transmit relatively low bandwidth signals until an event occurs, followed by a period of high bandwidth signaling. By designing ADCs to operate in the "worst case" situation, the power consumed (which, for MOS semiconductor devices, strongly correlates to the switching frequency) is increased and the power consumed is independent of the actual characteristics of the analog input signal.

In the prior known solutions, it has been recognized that the power consumed can be greatly reduced if signal processing circuits which follow the analog to digital converter stage are adapted to operate according to the actual frequency characteristics of the input signal. This reduction in power consumption can be attained for both asynchronous and synchronous ADCs.

In the prior known solutions, the frequency content or bandwidth of the input signal could be estimated using a full or fast Fourier transform. However, this approach requires a computationally expensive hardware and/or software solution to perform the Fourier analysis. Further this approach is applicable to uniform sampling systems, but not to all sampling systems.

In another prior known approach, a zero crossing detector can be applied to the input signal and the frequency content can be estimated from the zero crossings. However, DC offsets in the analog input signal must be compensated for. If this is not done, then, the zero crossing solution will be in error. Further, the power needed for implementing a zero crossing detector is large, frustrating the goal of reducing the power consumption in the system.

Improvements in the operations of ADC converters are therefore needed in order to address the deficiencies and the disadvantages of the prior known approaches. Solutions are needed that reduce the power consumption for the ADC operations, and which improve the overall system performance, for example in terms of performance metrics such as the signal to noise ratio (SNR) and both active and standby power consumption.

SUMMARY

In aspects of the present application, a bandwidth estimator for an analog to digital converter is configured to compute a bandwidth estimate of an analog signal and includes: an amplitude averaging block configured to determine an average incremental change in amplitude of N consecutive samples, a delta time block configured to determine a minimum time difference between consecutive samples; a peak voltage block configured to determine the maximum magnitude among N samples; a peak to root mean square block configured to determine a ratio of a peak voltage to the root mean square of the magnitude; a bandwidth estimator block configured to compute a product of a ratio of the average incremental change in amplitude to the minimum time difference, multiplied by a ratio of the peak voltage to the root mean square, squared, to the peak voltage multiplied by a constant; and a parameter adjustment circuit configured to output the parameter input signals to modify an analog signal sampling rate.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

The making and using of various example illustrative arrangements that incorporate aspects of the present application are discussed in detail below. It should be appreciated, however, that the illustrative examples disclosed provide many applicable inventive concepts that can be embodied in a wide variety of specific contexts. The specific examples and arrangements discussed are merely illustrative of specific ways to make and use the various arrangements, and the examples described do not limit the scope of the specification, nor do they limit the scope of the appended claims.

For example, when the term "coupled" is used herein to describe the relationships between elements, the term as used in the specification and the appended claims is to be interpreted broadly, and while the term "coupled" includes "connected", the term "coupled" is not to be limited to "connected" or "directly connected" but instead the term "coupled" may include connections made with intervening elements, and additional elements and various connections may be used between any elements that are described as "coupled."

Recognition is made in the aspects of this application of solutions including bandwidth estimation for providing an analog to digital converter that has optimized performance and reduced power consumption.

Figure 1:
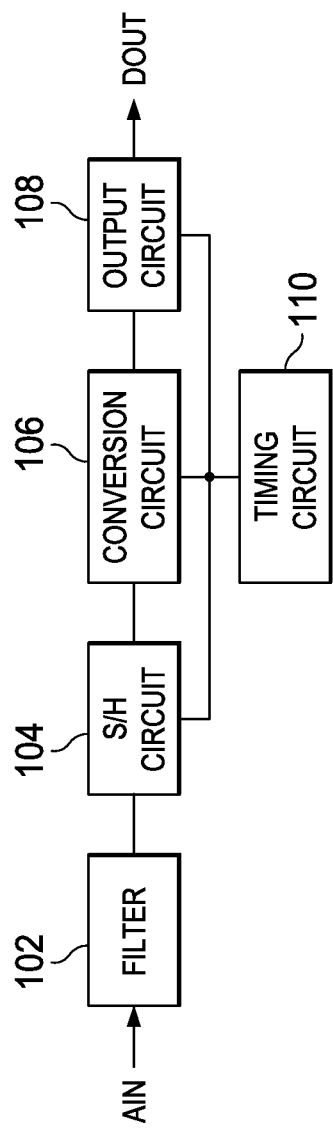
FIG. 1 is a block diagram of a synchronous analog-to-digital converter.

FIG. 1 is a block diagram of a synchronous analog-to-digital converter. In FIG. 1, an analog input signal AIN is first input into a filter 102 which can perform, for example, an anti-aliasing function such as a bandpass or lowpass filter function. The output of filter 102 is then coupled to the sample and hold circuit S/H 104. The sampling frequency is determined by the timing circuit 110. Samples of the analog signal are stored in hold circuits in block 104 for subsequent quantization into digital numerical representations of the sample magnitude, for example. A conversion circuit 106 receives the samples and performs a quantization to form the digital weights or other transform that is used to represent the analog signals in a digital form. The output circuit 108 then collects the digital representations and outputs digital data DOUT. Various techniques can be used in a synchronous ADC such as sigma delta, delta sigma, successive approximation and the like.

The sampling rate used in the S/H circuit 104 is determined by the expected signal bandwidth of the input signal AIN and the Nyquist rate, which gives the sampling rate needed to accurately reproduce the input signal from the digital samples. In a typical example, the actual sampling rate chosen exceeds the Nyquist rate, as this allows for error cancellation, anti-alias filtering and an increased signal to noise ratio in the digital representations. The sampling rate is typically based on the maximum expected bandwidth in the input signal. However, certain analog signals that are frequently input to ADCs have widely varying bandwidth that is often event driven. For example, human speech input into a signaling system exhibits a wide variation in frequency content. Other examples include "bursty" signals, such as signals from sensors, these sensors provide analog signals that have long periods of a relatively quiescent state, followed by short periods of activity at a much higher bandwidth in response to a detected event. The conventional approach to the ADC sampling rate makes a "worst case" assumption which, while accurately reproducing the signal in the digital domain, grossly oversamples the analog input signal in many situations, consuming power unnecessarily.

Figure 2:
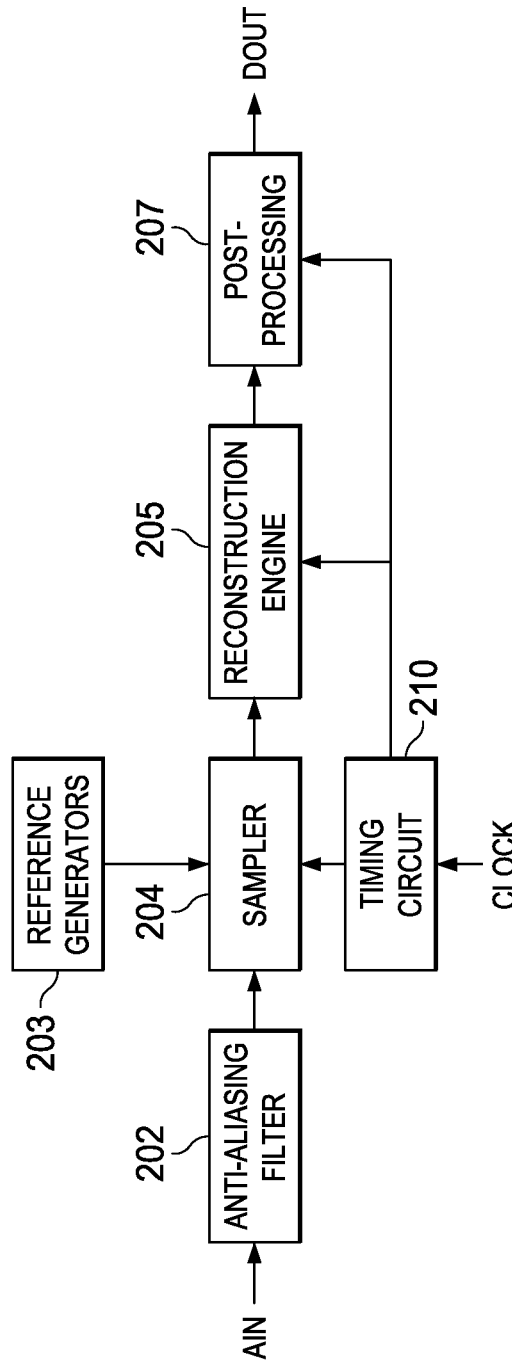
FIG. 2 is a block diagram of an asynchronous analog-to-digital converter.

FIG. 2 is a block diagram of an asynchronous analog-to-digital converter. In FIG. 2, the analog input signal AIN is input to the anti-aliasing filter 202 which can be implemented as a bandpass filter or lowpass filter, for example. A timing circuit 210 controls a sampler 204, which performs an asynchronous sampling of the analog signals. Reference generators 203 provide reference level voltages to the sampler 204. A reconstruction engine 205 receives the samples from sampler 204 and forms digital representations of the analog samples. This representation could be in uniformly or non-uniformly spaced samples depending on the requirement of circuits that follow. The reconstruction engine can include a digital to analog circuit (DAC) to use in checking the digital version against the analog input signal and can be used in adjusting the digital weights to account for quantization errors, for example. Post-processing block 207 forms digital output signals that are then output as signal DOUT. The post-processing block can include signal processing functions such as a digital filter to improve the signal to noise ratio of the output samples, for example.

Figure 3:
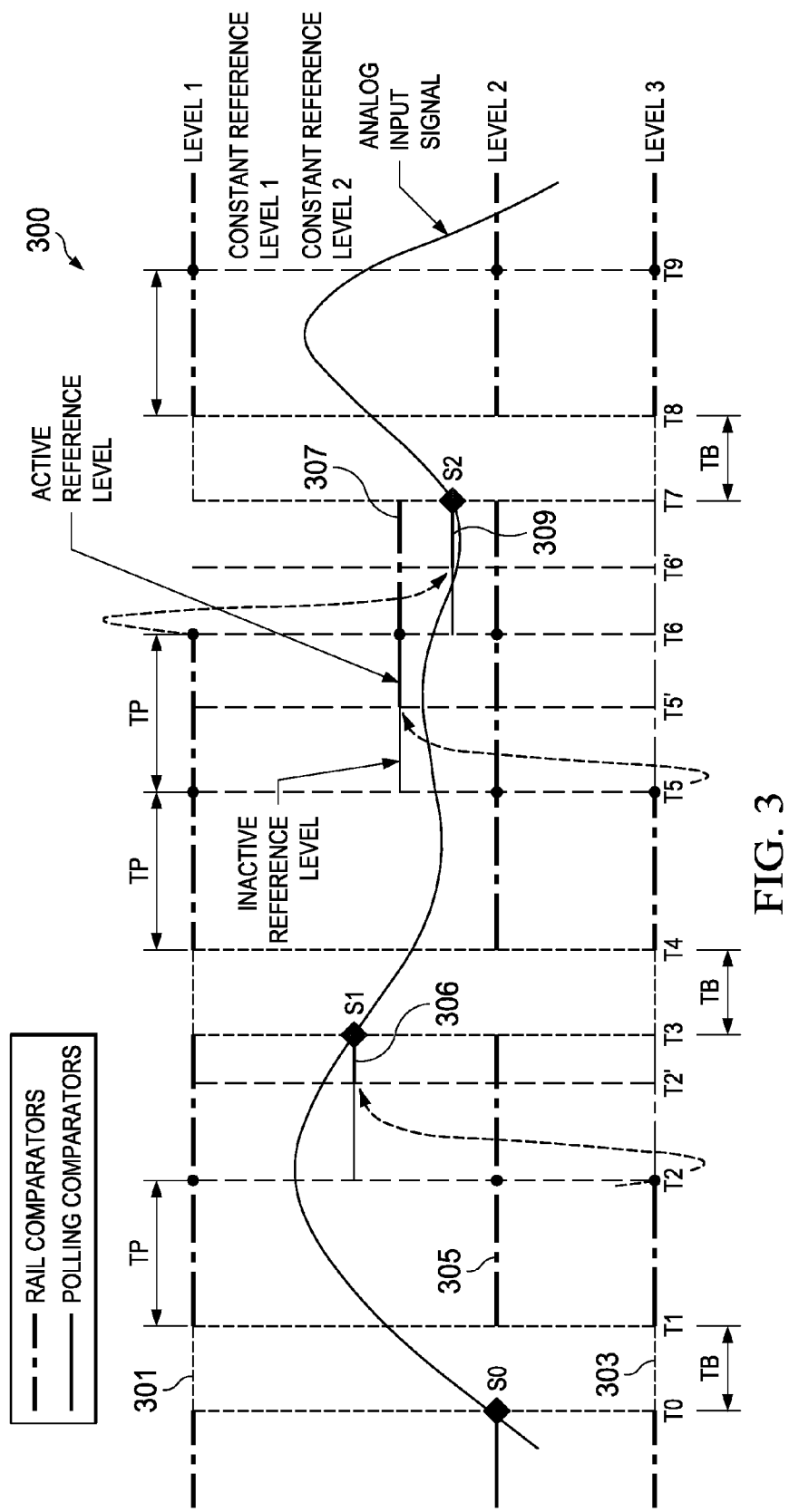
FIG. 3 illustrates in a timing diagram the operation of an asynchronous analog to digital converter for use in illustrating aspects of the present application.

FIG. 3 illustrates in a timing diagram the operation of an asynchronous analog to digital converter for use in illustrating certain aspects of the present application. In FIG. 3, in diagram 300, three level comparators with various voltage levels are used to sample an input signal labeled "Analog Input Signal." The voltage levels are shown on the vertical axis of the timing diagram in FIG. 3, and time increases along the horizontal axis. At an initial time T0, a first sample S0 is taken and the input signal voltage is sampled by the one comparator set to voltage Level 2 (labeled 305), with another comparator at Level 1 (labeled 301), and a third comparator at Level 3 (labeled 303). Following the sample time at T0, a blanking interval TB is allowed to pass to prevent jitter or other errors that can occur if sampling is performed again too soon after t0. At time T1, a polling operation begins, and the polling interval time TP extends to time T2. The input signal does not cross any of the three voltage levels of the comparators in this polling interval, so the comparator levels are changed. During the polling interval TP between times T1 and T2, the comparators at levels 301, 305, 303 indicate that the level of the input signal is greater than Level 2, and less than Level 1. Accordingly the comparator at Level 3 is moved to a new level 306 at time T2. After an inactive time, the comparator at level 306 now begins polling and a sample S1 is taken at time T3.

After another blanking interval TB following T3, another polling operation begins at time T4. The input signal does not intercept any of the three comparator levels during this polling interval. The comparators do indicate that the input signal is greater than Level 2 and less than Level 1, so at the end of the polling interval at time T5, the Level 3 comparator is moved to an intermediate level 307, and after an inactive time to let the comparator settle, begins polling at time T5. The input signal does not intercept any of the comparator voltage levels during the remainder of the polling interval that ends at time T6, but the signal is known to be between level 307 and Level 2. The voltage for the comparator at Level 1 is then adjusted to the level labeled 309, between the voltage level labeled 307 and Level 2, and at time T7, a third sample S2 is taken. After another blanking period, TB, the polling interval begins again.

The sampling frequency of an asynchronous analog to digital converter that operates in a manner similar to that illustrated in FIG. 3 is determined by several parameters. The time out value (To) is the maximum time allowed between two asynchronous samples. The slow snapout value is the difference between the digital to analog (DAC) codes of the rail comparators after an asynchronous sample is made by another comparator. The polling interval is the time difference (TP) between two consecutive polling operations of the analog to digital converter. The blanking interval is the time (TB) between the most recent asynchronous sample and the beginning of the next polling interval.

The sampling frequency of a synchronous analog to digital converter is determined by a sampling signal frequency, which can be a sampling clock frequency. In contrast, the sampling frequency of an asynchronous analog to digital converter is determined by the various timing parameters. The polling interval TP can be extended to reduce the sampling frequency, or it can be shortened to increase the sampling frequency. Similarly the blanking interval TB can be extended to reduce the sampling frequency, or it can be shortened to increase the sampling frequency. The time out value TO can be shortened or extended to change the sampling frequency, as can the slow snapout value.

The sampling intervals for the asynchronous analog to digital converter illustrated in FIG. 2 and operated as in FIG. 3 are thus not driven by a fixed or controllable sampling clock frequency (as in a synchronous ADC or sampler) but are instead determined by the parameters for the asynchronous sampler or asynchronous ADC such as the polling interval, the blanking time, and the settling times. These sampler or ADC parameters can be modified to decrease or increase the frequency of the operations in the converter. The effective sampling rate can then be modified in view of the characteristics of the input signal.

In an aspect of the present application, a bandwidth estimate is used in conjunction with an analog to digital converter to tailor the sampling frequency or the frequency of operations to the current characteristics of the input signal. In the present application, a novel bandwidth estimate that is computationally efficient is applied. In this manner power consumption in a device or system can be reduced by tailoring the ADC sampling operations to the bandwidth of the analog input signal in its current condition, and not in an expected "worst case" or broad coverage condition. Advantageously, the novel bandwidth estimation incorporated in aspects of the present application can be used independently of the ADC or sampler type, and can be incorporated with asynchronous and synchronous samplers within an ADC, or alternatively, the bandwidth estimation of the present application can be used with asynchronous or synchronous ADCs without the necessity of modifying the hardware in the ADCs.

Figure 4:
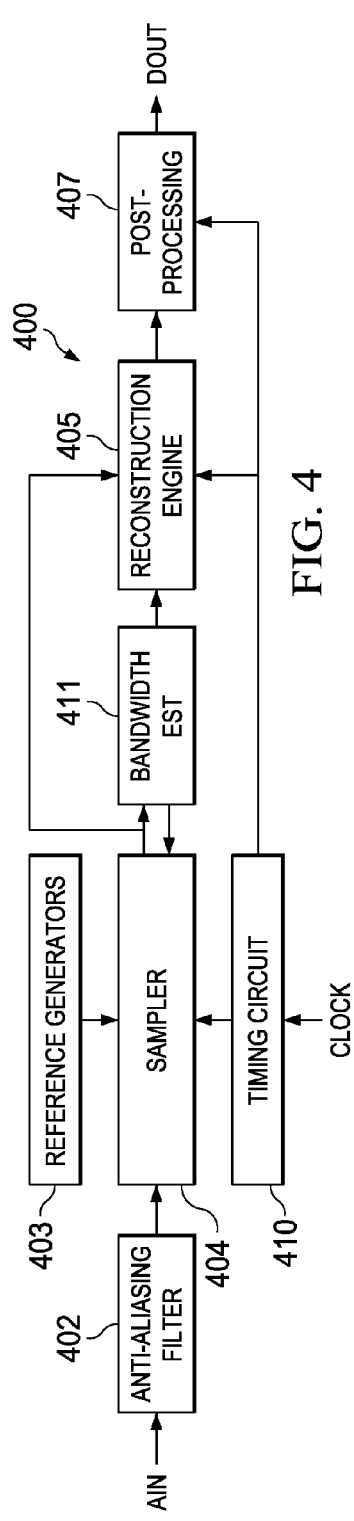
FIG. 4 illustrates in a block diagram an analog-to-digital converter including a bandwidth estimator in an aspect of the present application.

FIG. 4 illustrates in a block diagram an analog-to-digital converter including a bandwidth estimator in an aspect of the present application. In FIG. 4, the analog to digital converter 400 includes many blocks similar to those shown above and further incorporates a novel bandwidth estimation function 411. Analog signal AIN is input to the anti-aliasing filter 402, which is coupled to a sampler 404. Reference generators 403 provide reference level voltages to the sampler 404, a timing circuit 410 provides timing signals to the sampler 404, and a bandwidth estimator 411, a reconstruction engine 405, and a post-processing block 407 complete the ADC 400. The ADC 400 then outputs a digital output signal DOUT that contains the digital representation of the analog input signal AIN. In the arrangement of FIG. 4, the sampler 404 can be synchronous. In an alternative arrangement that is also contemplated by the inventor, the sampler 404 can be asynchronous and in this arrangement, the digital output signal DOUT will have non-uniformly time spaced samples.

In operation, the bandwidth estimator 411 in FIG. 4 receives the samples directly from sampler 404, and makes an estimate of the bandwidth of the input signal in its current condition. This bandwidth estimate can be used to modify parameters of the sampler 404 to increase, or decrease, the sampling rate, the polling intervals, the blanking interval, the number of samples in a given interval, based on the current estimated bandwidth. By greatly reducing the activity of the sampler 404 when the analog input signal AIN has a low bandwidth, power consumption is greatly reduced. In MOS circuitry that is typically used to implement the circuits in the ADC, the power consumed is generally proportional to the frequency of operations, so that by reducing the frequency of operations when possible, power consumption can be greatly reduced, especially in comparison to the power consumption of the prior known solutions.

The bandwidth estimation function 411 performs a novel computation in another aspect of the present application. The novel bandwidth estimation is computationally efficient and relatively low in cost to implement in hardware, or alternatively, to perform in software or firmware.

In a first step of the novel bandwidth estimation arrangement, discrete output samples from an ADC, or samples from a sampler within an ADC, are processed to compute the average absolute difference in magnitude between any two consecutive samples in the sample buffer. That is, in the novel arrangement for estimating the bandwidth, an average value is computed using a series calculation on a set of N discrete samples as in Equation 1:

$$\overline{\Delta x} = 1/N [\Sigma_{i=1}^{N+1} |x_i - x_{i-1}|]  \quad \text{Equation 1.}$$

In a second step of the arrangement, the time instants of the output samples from the sampler are processed to compute the absolute difference between the times of sampling of any two consecutive samples in a sample buffer. That is, the arrangements compute the minimum time change as in Equation 2:

$$\min \Delta t = \min[t_i - t_{i-1}], i=2,\ldots,N+1 \quad \text{Equation 2}$$

In another step of the arrangement, a peak voltage Vp is computed. The maximum absolute signal amplitude of the N samples in the buffer is computed. i.e., as in Equation 3:

$$V_p = \max[|x_1|, |x_2|, \ldots, |x_{N+1}|] \quad \text{Equation 3}$$

Note that the computations in Equations 1, 2 and 3 can be performed in any order, and the computations can be performed simultaneously, or in an alternative arrangement, in a series fashion. Note also that these computations can be performed in a pipelined mode by updating the computation as each new sample arrives. All of these arrangements form additional aspects of the present application that are contemplated by the inventor and which fall within the scope of the appended claims.

In another step of the novel arrangement for estimating the bandwidth, the peak to root mean square ratio (peak to RMS or "PRR") is computed from the peak voltage Vp and the RMS for the discrete samples in a sample buffer as shown in Equation 4:

$$PRR = \frac{V_p}{\sqrt{\sum_{i=1}^{N+1} |x_i|^2}} \quad \text{Equation 4}$$

In the final step of the arrangement for estimating the bandwidth, the bandwidth estimate for the input signal from the samples in the buffer is computed as shown in Equation 5:

$$BWest \approx \left(\frac{\overline{\Delta x}}{\min \Delta t}\right) \frac{PRR^2}{KV_p} \quad \text{Equation 5}$$

Where the constant K is a proportionality constant which can be used tailor the bandwidth estimate by overestimating, or underestimating, the bandwidth estimate value, as appropriate for different applications.

In an example illustrative arrangement, the proportionality constant K for a 6× oversampled ADC was selected to be equal to 8. K can also be selected to be other values. Simulation software can be used to evaluate different possible values of K. Alternatively, experimental observations can be used with test analog signals to confirm the optimum value for K.

Table 1 presents simulation results showing results obtained using the bandwidth estimate of Equation 5 above for different input signals.

TABLE 1

| Signal Type | Peak Amplitude (in Voltes) | Bandwidth/ Frequency | Estimated BW (avg. over 5K samples) | Estimation Error (in percentage) |
|---|---|---|---|---|
| Tone | 1.5 | 39 KHz | 43.6 KHz | 11.8 |
|  | 1.5/16 | 3.9 MHz | 4.49 MHz | 12.3 |
| OFDM | 1.5 | 4 MHz | 3.69 MHz | −7.8 |
|  | 1.5/2 | 4 MHz | 3.70 MHz | −7.5 |
| Two tones | 1.5 | 3.9, 3.1 MHz | 4.49 MHz | 15.1 |
|  | 1.5/8 | 3.9, 3.1 MHz | 4.69 MHz | 20.2 |
| Bandlimited | 1.5 | 1 MHz | 1.02 MHz | 2.0 |
| Square wave | 1.5/4 | 1 MHz | 1.02 MHz | 2.0 |

In Table 1, the error shown varies for different input signal types and for different frequencies. The constant K can be varied to tailor the bandwidth estimate for a given input signal type using either simulation results, as shown above, or by using experimental observations on test signals.

Once the bandwidth estimate "BW est." is computed, this bandwidth estimate can be used to adjust various parameters for an ADC or a sampler in order to tailor the performance of the ADC system so as to optimize the power consumption and ADC performance for a given input signal condition For example, in one aspect of the present application, the bandwidth estimate can be used in conjunction with a synchronous ADC by adjusting the synchronous sample rate, which can be implemented by adjusting a sampling clock rate, for example. Power consumption can be optimized by lowering the sample rate when the input signal has a low rate of change (lower bandwidth) thereby saving power; in other examples the sample rate can be increased when the bandwidth estimate indicates the frequency content of the input signal is increased.

In another alternative arrangement of the present application, the bandwidth estimate can be used to adjust parameters in an asynchronous analog to digital converter. By adjusting the blanking time, settling time and polling time in the sampler, the effective sampling rate of the asynchronous ADC can be adjusted to reduce power consumption when the input signal has a low frequency content; and in cases where the bandwidth estimate indicates the input signal has an increasing frequency content, the parameters for the asynchronous ADC can be adjusted so as to increase the effective sampling rate.

The novel bandwidth estimate that is used in the arrangements of the present application is easy and efficient to compute, especially compared to the cost of computation for the fast or short time Fourier transforms or the wavelet transform methods used in the prior known solutions. The bandwidth estimation of Equation 5 can alternatively be computed on a periodic basis using running computation methods. That is, the computations of Equations 1-4 can be updated for each newly arriving discrete signal sample "n" and the final computation of Equation 5 can be performed when a predetermined integer number N samples have been processed. In this manner, the bandwidth estimate of the arrangements of the present application is amenable to pipelined calculation. In an alternative arrangement, a buffer of N input samples is collected, and then the computations of Equations 1, 2, 3, and 4 are performed, finally the bandwidth estimate of Equation 5 is computed. By using multiple input buffers, the bandwidth estimate can be calculated for a first set of samples while simultaneously sampling the input signal for a second set of samples, this can be done by alternatively swapping the input buffer with the stored sample buffer so that the input signal can be more or less continuously monitored. Each of these variations in the computations form additional aspects of the present application that are contemplated by the inventor and which fall within the scope of the appended claims.

In arrangements that form additional aspects of the present application, the bandwidth estimate can be performed in hardware, software, firmware or combinations of these. Various programmable processors such as commercially available mixed signal processors, digital signal processors, and microcontrollers can be used. Processor cores provided as design macros such as MSP, DSP, RISC and ARM machine cores can be used. Dedicated hardware blocks formed in a functional library in a sea of gates, ASIC, FPGA or CPLD design programmable device methodology can be used to provide the above described bandwidth estimate functions. Combinations of these implementations can also be used and these various approaches are also contemplated as additional aspects of the present application.

However it is computed, the bandwidth estimate can be used, in a further aspect of the present application, in an arrangement with an asynchronous analog to digital converter to adjust the parameters that determine the sampling frequency. As shown in Equation 6, the time out value TO can be adjusted according to the bandwidth estimate "BW est.:"

$$TO = \frac{k1}{(2*Bwest)}, \text{ where } k1 \text{ ranges from 0.5 to 0.8}$$ Equation 6 depending on the maximum sampling rate limit of the ADC

The polling time TP can be adapted according to the time out computed in Equation 6, as shown in Equation 7:

$$TP = \left(\frac{To}{2.5}\right), \text{ the polling time } TP \text{ controls the sampling rate}$$ Equation 7

The snapout value "Snapout" also controls the sampling rate. This parameter can be adapted according to the bandwidth estimate "BW est" as shown in Equation 8:

$$\text{Snapout} = 2^{[log(sin[2\pi*BWest*TP]/LSB)}$$ Equation 8

The blanking time TB can also be adjusted to further control the sampling rate by adjusting the parameter in proportion to the adjustment to the polling time, as shown Equation 9.

$TB=k2*TP$, where $k2$ is chosen between 1.5 and 2 for further controlling the sampling rate    Equation 9

Figure 5:
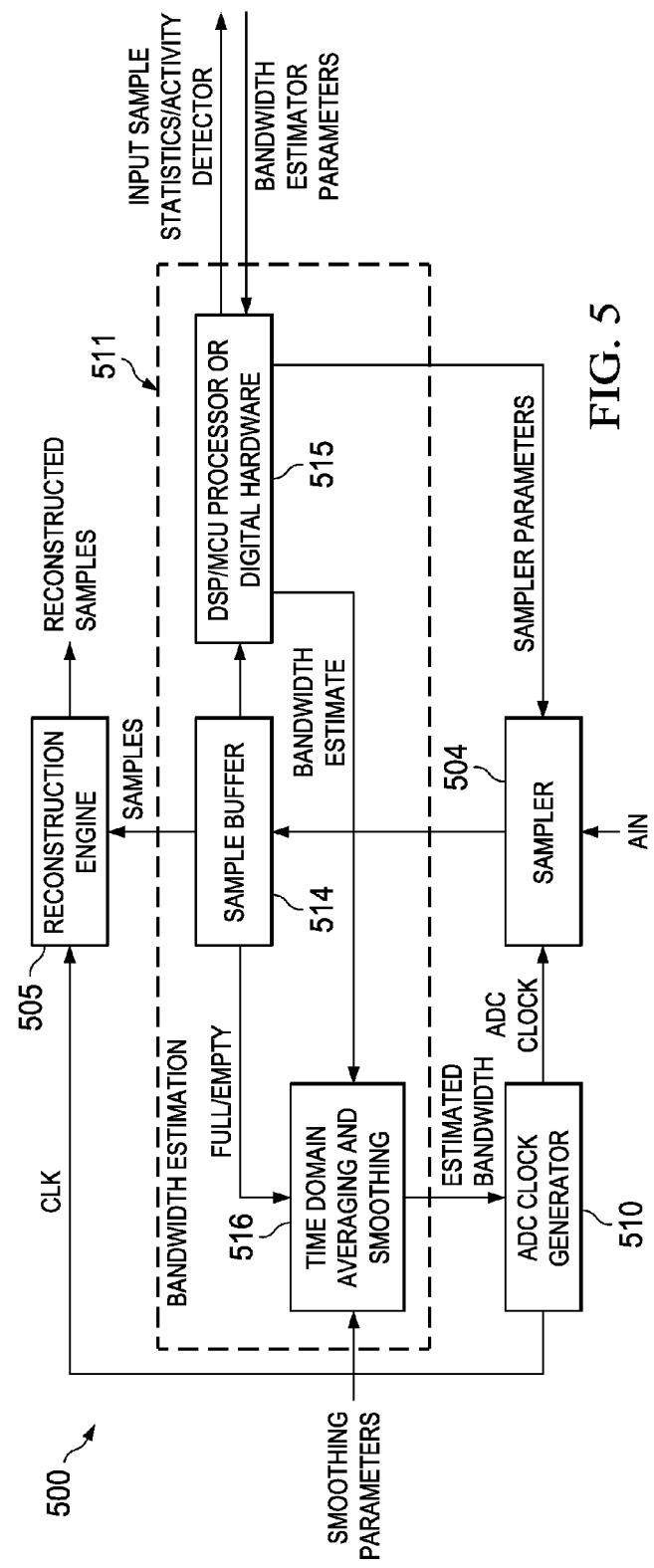
FIG. 5 illustrates, in a block diagram, an example analog to digital converter and an alternative bandwidth estimation arrangement in another aspect of the present application.

FIG. 5 illustrates, in a block diagram, an example analog to digital converter and an alternative bandwidth estimation arrangement in another aspect of the present application. In FIG. 5, an analog to digital converter 500 is shown in a block diagram. A sampler 504 samples analog signals labeled AIN. Clock or timing information is provided from the ADC Clock Generator 510.

A bandwidth estimation block 511 receives the samples from the sampler 504. The samples are stored in a sample buffer 514 for use in the bandwidth estimate computation. A processor 515 that can be a DSP, MCU, microprocessor or dedicated hardware retrieves the stored samples from sample buffer 514 and performs the calculations described above in Equations 1-5 for each N samples. The output of the processor 515 is the "BW est" computed as described above. The processor 515 also outputs a set of parameters labeled "Sampler Parameters" from the bandwidth estimation block 511 to the sampler 504. The bandwidth estimation block 511 also outputs a Bandwidth Estimate to the ADC Clock Generator 510 to adapt the sampling frequency. Further smoothening of the estimated bandwidth is done explicitly by block 516 which could be implemented in hardware, while bandwidth computation is done in software, or vice versa. In another aspect of the invention, block 516 can be merged with block 515 providing additional flexibility to output the short term bandwidth changes and long term bandwidth changes. In addition, the DSP/MCU 515 in bandwidth estimator 511 outputs input sample statistics and activity detection signals to the system as shown by the arrows labeled "Input sample statistics/Activity Detector", and receives BW estimator parameters (weighting constant K, described above, for example) from the system.

The samples are output from the bandwidth estimation block 511 to the Reconstruction Engine 505, and the reconstructed samples are output by the Reconstruction Engine 505 as digital values to the system.

Figure 6:
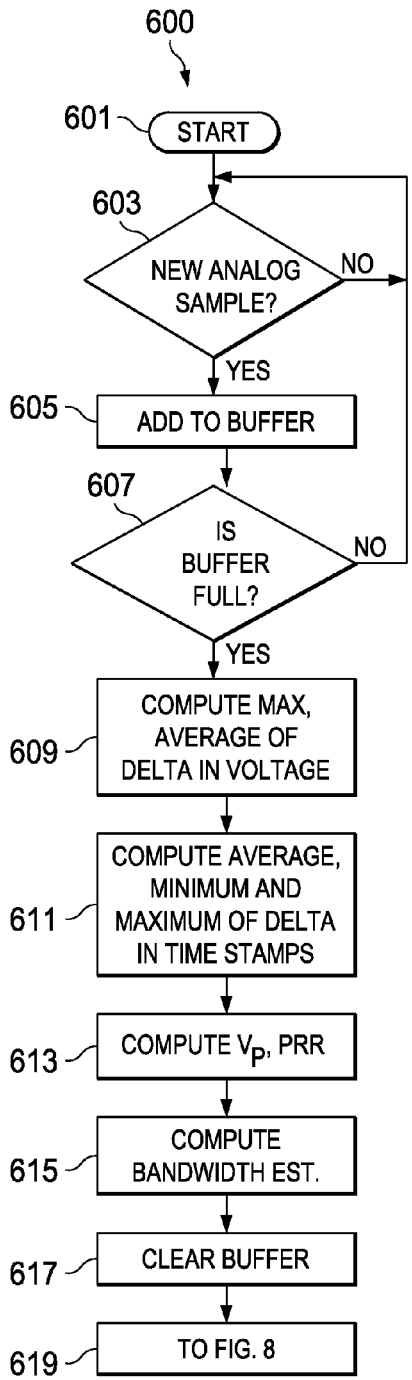
FIG. 6 illustrates, in a flow diagram, a method for performing a bandwidth estimate in another aspect of the present application.

FIG. 6 illustrates, in a flow diagram 600, a method for performing a bandwidth estimate in another aspect of the present application. In FIG. 6, the method begins at step 601, "Start." At step 603, a new analog sample is obtained, or if not, the diagram returns to step 601. Once a new sample is obtained, the diagram transitions to step 605, "Add to Buffer", and the sample is stored in a sample buffer. At step 607, a conditional test is made to determine if the sample buffer is full, if it is full, the method transitions to step 609, otherwise, the method transitions back to steps 601, 603 to await additional signal samples.

At step 609 in FIG. 6, the bandwidth estimate computations begin. First the voltage computations needed for Equations 1 and 3 are made. As shown in FIG. 6, the step 609 also includes computing the average of the voltage differences. In an alternative arrangement to the ones described above, the bandwidth estimate described above can use the average voltage difference or the maximum voltage difference, for various applications one approach can be more closely tailored to the input signal than the other. The choice of the voltage variable can be confirmed by simulation, for example. These variations form additional aspects of the present application that are contemplated by the inventor and which fall within the scope of the appended claims. Next, at step 611, the minimum delta in time of the samples is computed. In step 611, the average, minimum, or maximum of the difference in time stamps can be computed. Again, the choice of the time variable used can be made based on simulation results to tailor the bandwidth estimate performance to a particular application and input signals. If all of these results are not needed for a particular bandwidth estimation that is being used, some of these steps can be omitted.

At step 613, the method illustrated in FIG. 6 continues by computing the peak voltage Vp, and the PRR ratio, using the computations of Equations 3 and 4 above. At step 615, the bandwidth estimate "BW Est" is computed as shown in Equation 5, above. At step 617, the storage buffer is cleared, and the method transitions to step 619 and goes onto the flow diagram at FIG. 8. The method of flow diagram 600 can be re-executed by starting again at step 601.

Figure 7:
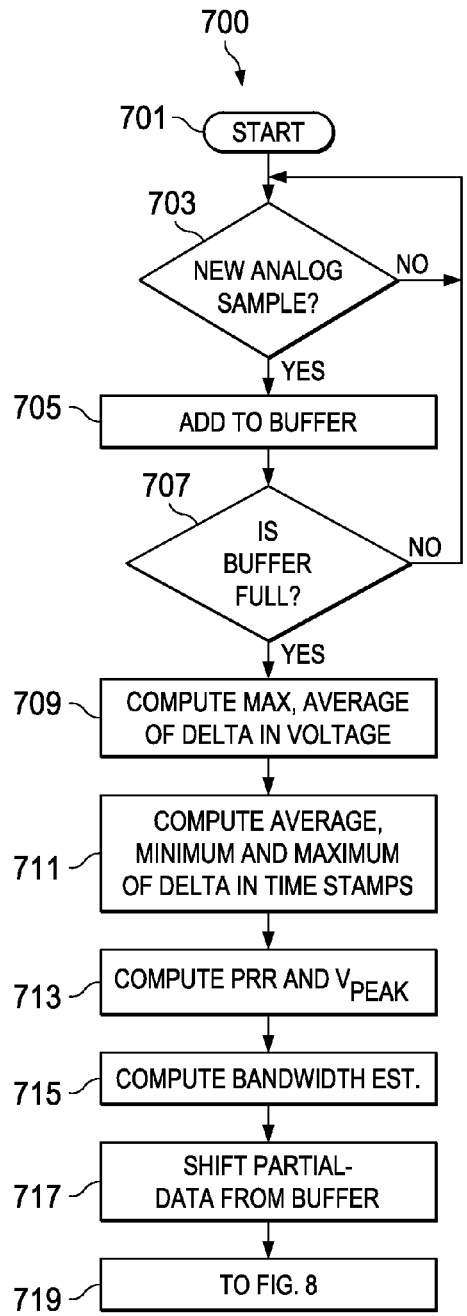
FIG. 7 illustrates in a flow diagram an alternative method for computing the bandwidth estimation that forms another aspect of the present application.

FIG. 7 illustrates in a flow diagram 700 an alternative method for computing the bandwidth estimation that forms another aspect of the present application. In FIG. 7, the method begins at step 701, "Start." At step 703, a conditional test is made to determine whether a new signal sample is available. If there is a new signal sample, the method transitions to step 705, and if not, the method returns to step 701 and then back to step 703 until a new sample is received.

At step 705 the new sample is added to a sample buffer. At step 707, a conditional determination is made based on whether the buffer 707 is full. At step 709, the bandwidth estimate computations begin. First the voltage computations needed for Equations 1 and 3 are made. As discussed above with respect to FIG. 6, the voltage measurements used can be varied to include the maximum difference or delta, the average difference or delta in the voltage magnitudes of the samples. Next, at step 711, the minimum delta in time is computed. Note that as discussed above with respect to FIG. 6, the time computations that can be used in the bandwidth estimate can also be varied to include the minimum time between samples, the average time, and the maximum time, depending on the input signal and the particular bandwidth estimation that is being used. Computations in step 711 that are not needed for a particular bandwidth estimate can be omitted.

At step 713, the method illustrated in FIG. 7 continues by computing the peak voltage VPEAK, and the PRR ratio, using the computations of Equations 3 and 4 above. At step 715, the bandwidth estimate is computed as shown in Equation 5, above. At step 717, in this particular example method, a partial data shift is made from the sample buffer. In this example implementation, a running computation can be made, as in a pipelined computation system, and the bandwidth estimate can be made on a part of the sample data stored in the buffer, while new samples are shifted in. At step 719, the method transitions to the flow diagram shown in FIG. 8. The method of FIG. 7 can be re-executed by starting again at step 701.

In the method of FIG. 7, running computations can be used on a part of the samples in a storage buffer which can then be shifted after the bandwidth estimate is made, and another computation performed, to continuously update the bandwidth estimate as samples of the analog input are taken.

Figure 8:
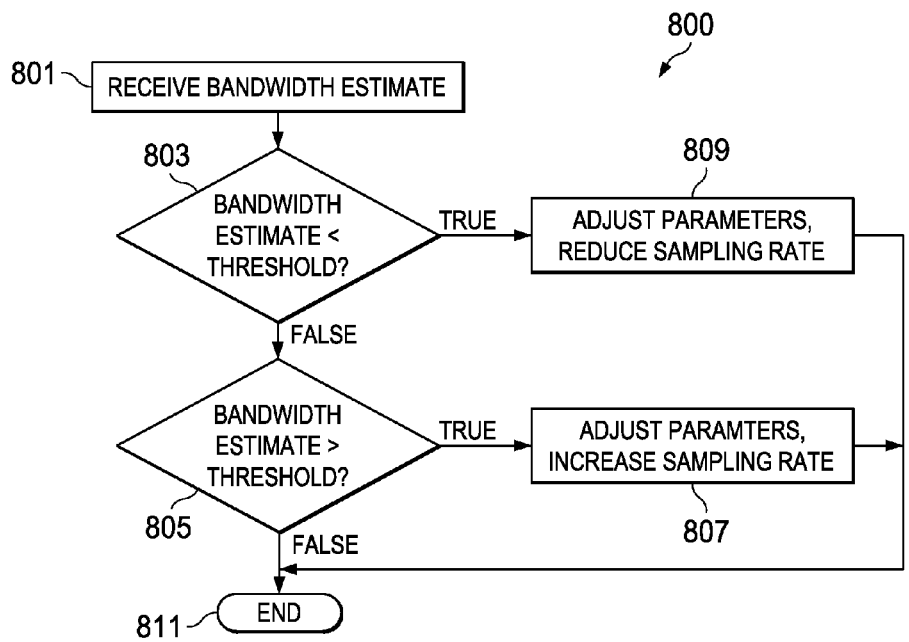
FIG. 8 illustrates in a flow diagram a method for adjusting parameters for an ADC that forms another aspect of the present application.

FIG. 8 illustrates in a flow diagram additional aspects of the present application. In FIG. 8 the diagram 800 illustrates, at step 801, a bandwidth estimate is received from either of the above described methods, 600 and 700. At step 803, a comparison is made between the bandwidth estimate and a threshold. If the bandwidth estimate indicates the input signal bandwidth is lower than a threshold, the method transitions to step 809. At step 809, the parameters of the sampler or the ADC are adjusted to reduce the sampling rate, thus conserving power.

At step 805, a second determination is made to determine whether the bandwidth estimate is greater than a threshold. This can indicate a bandwidth that is increasing. If this determination is true, then the method transitions to step 807. In step 807, the sampling rate of the sampler or ADC is increased, which will increase power consumption but also matches the bandwidth of the input signal, to insure that the analog signal can be correctly.

After step 809 or 807 are performed the method transitions to step 811 and ends. If the bandwidth estimate is neither less than the first threshold, or greater than the second threshold, then the method transitions to step 811 and ends.

Figure 9:
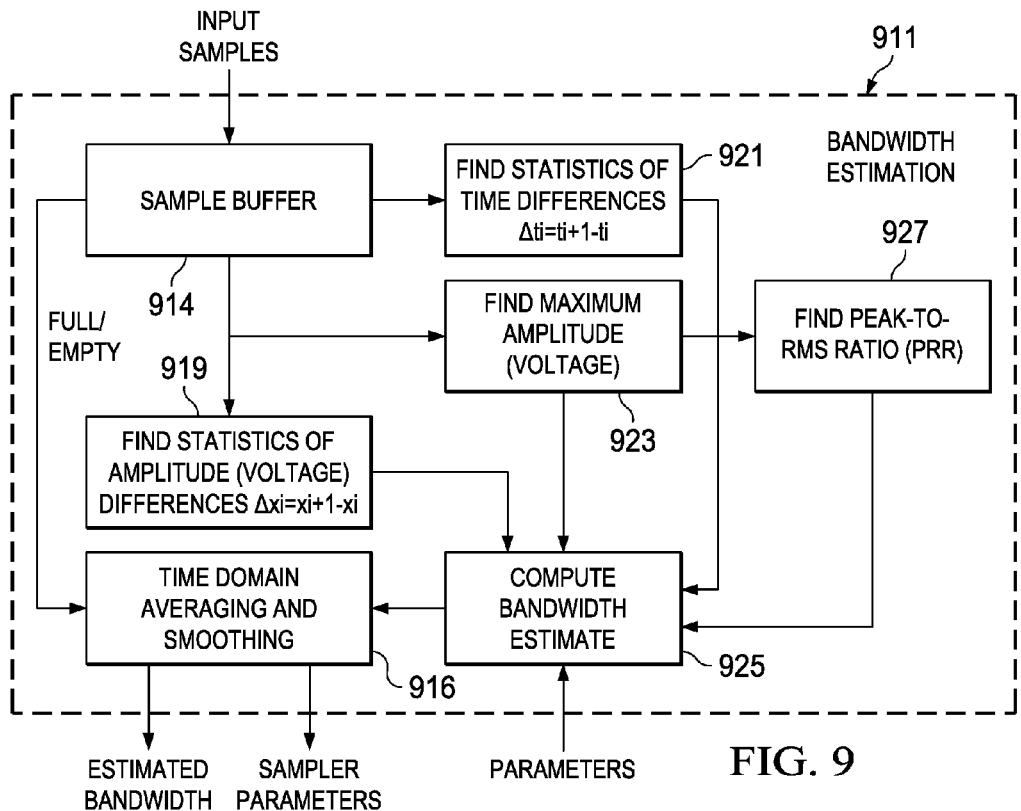
FIG. 9 illustrates in a block diagram an arrangement for bandwidth estimation that forms another aspect of the present application.

FIG. 9 illustrates in a block diagram an arrangement for bandwidth estimation that forms another aspect of the present application. In this example arrangement, which can be part of an ADC system, in a bandwidth estimation block 911, input samples from a sampler or an ADC (not shown in FIG. 9) can be received into a sample buffer 914. The samples stored in sample buffer 914 are output to functional blocks 921, 919, 923. Each of these functional blocks performs a computation analogous to the Equations 1-3 described above. Block 919 performs the computation of Equation 1, for example, determining the voltage differences between successive samples in the sample buffer 914. Block 921 performs computations such as in Equation 2, above, determining the time differences between samples in the sample buffer. Block 923 determines the maximum or peak voltage Vp as in Equation 3. Block 927 performs the computation of Equation 4, finding the PRR. Block 925 receives as input parameters such as the constant K described above. Block 925 then performs the computation of the bandwidth estimate as in Equation 5, above. The output of the bandwidth estimate is then used by block 916 and parameters are modified for the ADC (not shown) or sampler (not shown) in the system.

Each of the computation blocks 919, 921, 923, 927, and 925 shown in FIG. 9 can be implemented, as a non-limiting example, as a dedicated hardware function using logic gates, multipliers, summers, arithmetic logic units (ALUs) and the like. In an alternative arrangement, the blocks 919, 921, 923, 925, 927 can also be implemented as executable programs which cause a processor to perform the computations of Equations 1-5. In still additional alternative arrangements, certain ones of the blocks 919, 921, 923, 925, 927 can be provided as executable software in a processor while other ones are implemented as dedicated hardware functions. All of these arrangements and any obvious variations of these arrangements are contemplated by the inventor of the present application as forming additional aspects of the application which are within the scope of the appended claims.

Figure 10:
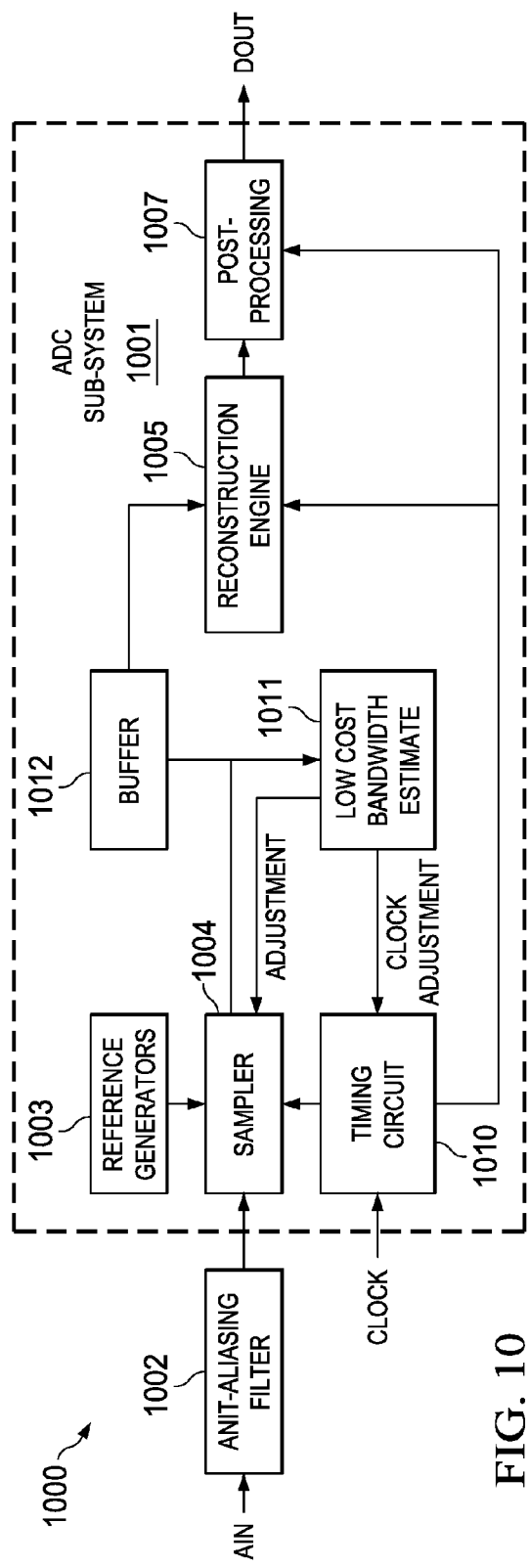
FIG. 10 illustrates in a block diagram an analog to digital converter incorporating in another aspect of the present application a bandwidth estimator.

FIG. 10 illustrates in a block diagram an analog to digital converter incorporating the in another aspect of the present application a bandwidth estimator. In FIG. 10, ADC 1000 includes an input for an analog signal AIN, which is coupled to an Anti-Aliasing Filter 1002, which is then coupled to an ADC Sub-system 1001. The ADC Sub-system 1001 includes a sampler 1004, which is coupled to Reference Generators 1003, a Timing Circuit 1010, a Buffer 1012, a Reconstruction Engine 1005, a Post Processing block 1007, and a low cost bandwidth estimator 1011 that performs the bandwidth estimation described above. In the arrangement of FIG. 10, the low cost bandwidth estimator 1011 is arranged within the ADC Sub system 1001 and next to the sampler 1004 which receives adjusted parameters from the low cost bandwidth estimator. A characteristic of this arrangement is that the low cost bandwidth estimator 1011 and the sampler 1004 form a low latency path, that is, changes in the input signal Analog Signal are rapidly included in the bandwidth estimate computed by the bandwidth estimator 1011. The sampler 1004 parameters can thus be rapidly adjusted. Further the timing circuit 1010 can be adjusted quickly in response to changes in the input signal bandwidth. The ADC Sub-system 1001 can be used in a synchronous ADC and alternatively can be used in an asynchronous ADC circuit in aspects of the present application. Advantageously, the bandwidth estimate calculations used in the arrangements of the present application are independent of whether a synchronous or asynchronous ADC is used.

Figure 11:
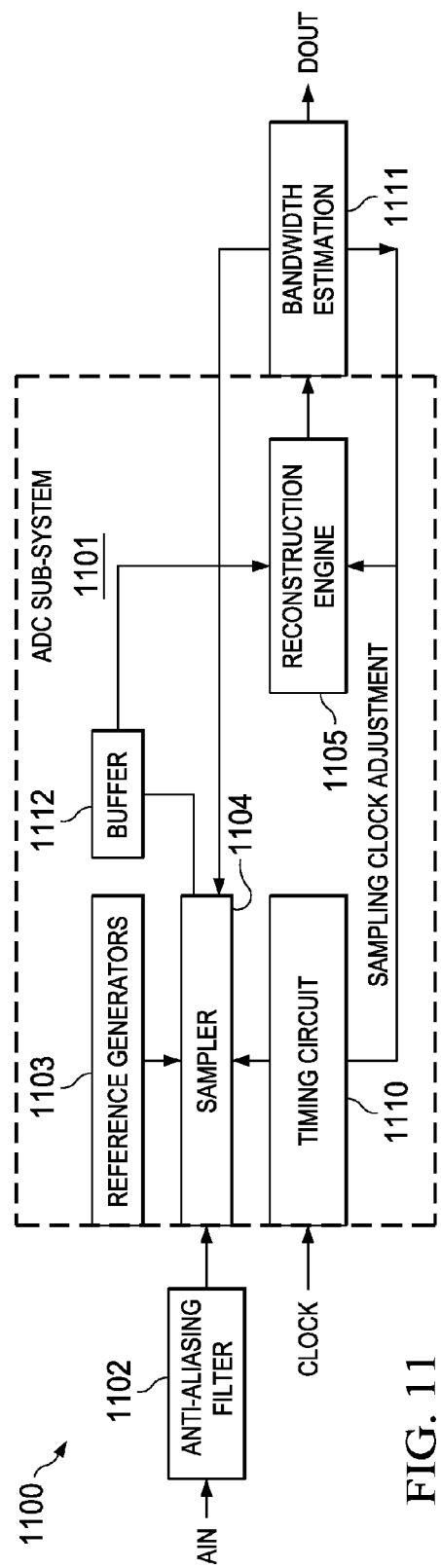
FIG. 11 illustrates in a block diagram yet another arrangement for an analog to digital converter arrangement that forms an additional aspect of the present application.

FIG. 11 illustrates in a block diagram yet another arrangement for an analog to digital converter that forms an additional aspect of the present application. In FIG. 11, ADC 1100 includes a bandwidth estimation block 1111 is coupled to an ADC subsystem 1101 after the reconstruction engine 1105; that is, after the digital representations are formed. In this alternative arrangement, the novel bandwidth estimation of the present application can be incorporated with an existing analog to digital converter by coupling the bandwidth estimation block 1111 to the output of the ADC Sub-System 1101. The ADC Sub-system can include a Sampler 1104, Reference Generators 1103, a storage Buffer 1112, a Reconstruction Engine 1105, a Timing Circuit 1110. The output of the Bandwidth Estimation 1111 includes parameters that are input to the Sampler 1104. The sampling clock can be adjusted at the Timing Circuit 1110 in response to a signal Sampling Clock Adjust from the Bandwidth Estimation 1111. The analog input signals are input to an Anti-Aliasing Filter 1102, and the output is coupled to the ADC Sub-system 1101.

As shown in FIG. 11, the bandwidth estimation arrangements include an arrangement where the bandwidth estimator 1111 is coupled to the digital signal output of an ADC. This arrangement enables the addition of the novel bandwidth estimator of the present application to an existing ADC system to further optimize performance without the need for otherwise modifying the ADC system. The bandwidth estimate obtained can be used, for example, to decrease or increase the clock rate of a synchronous ADC, or to adjust the parameters of an asynchronous ADC to increase or decrease the effective sampling rate dynamically.

Figure 12:
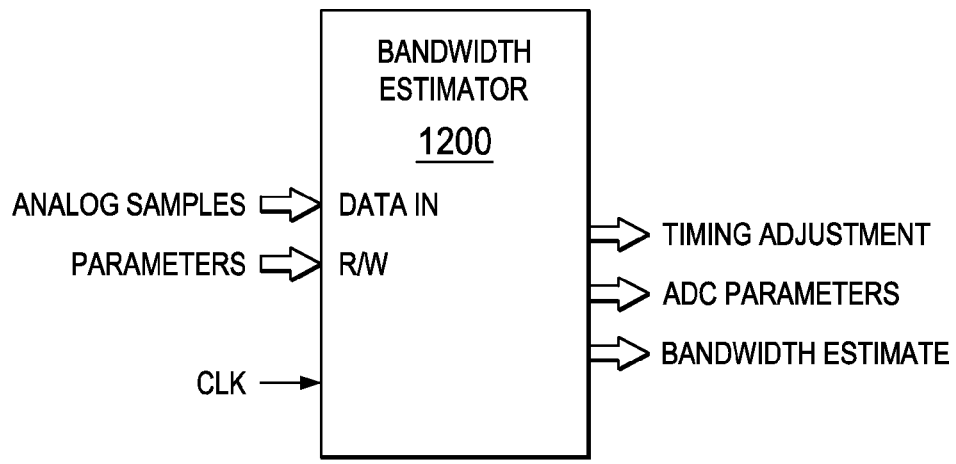
FIG. 12 is a block diagram of an example bandwidth estimator that forms another aspect of the present application.

FIG. 12 is a block diagram of an example bandwidth estimator arrangement that forms another aspect of the present application. In FIG. 12 a simple block diagram depicts a bandwidth estimator 1200. In one arrangement that forms an aspect of the present application, the bandwidth estimator 1200 can be implemented as a standalone integrated circuit. In another arrangement, the bandwidth estimator 1200 can be formed as a macro or ASIC library module for use with other user specified functions on a highly integrated circuit. In another alternative arrangement, the bandwidth estimator block 1200 can be implemented using multiple integrated circuits, for example a program store such as an EEPROM or ROM for storing executable instructions, and a processor or microprocessor, DSP, MSP, or MCU integrated circuit can be used to form the bandwidth estimator 1200.

Figure 13:
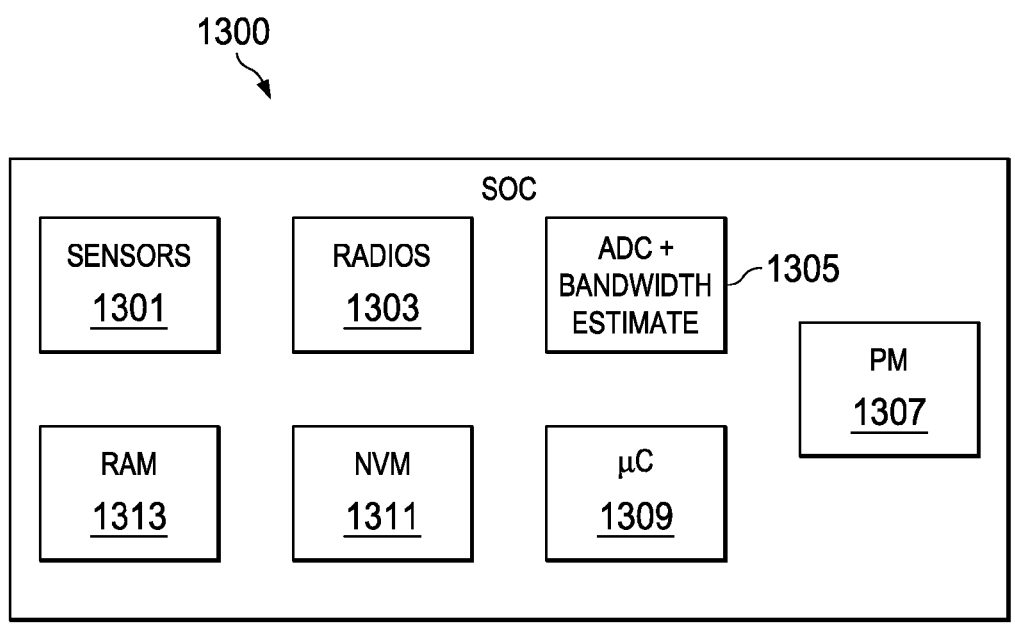
FIG. 13 illustrates in a simplified block diagram a system on a chip ("SOC") integrated circuit incorporating a bandwidth estimator and an ADC that forms another aspect of the present application.

FIG. 13 illustrates in a simplified block diagram a system on a chip ("SOC") integrated circuit incorporating a bandwidth estimator and an ADC that forms another aspect of the present application. In FIG. 13, the SOC 1300 includes sensors 1301, radios 1303, a processor or microcontroller "μC" 1309, non-volatile memory or "NVM" 1311, and RAM memory 1313. An analog to digital converter 1305 including the novel bandwidth estimator of the arrangements of the present application is also included in the SOC 1300. Also, SOC 1300 can include more, fewer, or different functional blocks. The sensors 1301 can be any one of a variety of sensor types such as sensors sensing pressure, temperature, sound, light, noise, user input from a control panel, etc. Radios 1303 can implement a variety of interfaces between the SOC 1300 and external devices using a variety of over the air interfaces. Examples of over the air interfaces include, for non-limiting examples, Bluetooth, WiFi, WiMAX, cellular communications such as 3G, 4G, LTE, radio frequency standards such as used for RFID tags, and the like. ADC+BW Est. block 1305 can implement a variety of analog to digital conversion functions such as sigma delta analog to digital converters (ADCs), recursive and pipelined ADCs, and the like used for receiving analog signals from the sensors, for example, and for outputting digital data for use by other blocks in the SOC. Power management "PM" 1307 can implement a variety of power management functions, such as clock speed control, battery management, sleep, wait states, etc. to extend the life of a battery for a portable device application, for example. Microcontroller 1309 can be implemented using a wide variety of existing processors provided as cores or macros such as mixed signal processors (MSPs), digital signal processors (DSPs), reduced instruction set machines such as RISC cores, advanced RISC machines such as ARM cores, general purpose microprocessors, and microcontrollers. Simple state machines can also be used as microcontroller 1309.

Various aspects of the present application are compatible with a wide variety of applications. In some applications, portable devices including SOCs typically have sleep, stand by, and other power saving modes typically used in order to preserve battery life. These power saving modes often involve reducing a clock frequency, since lower clock frequencies save power in most integrated circuit devices. SOC 1300 can be adapted using user defined functions in the form of additional hardware blocks, or in the form of software instructions to be executed by the microcontroller or processor 1309, to implement a variety of single chip solutions for applications. Examples include without limitation video and music players, camcorders, cameras, cellphones, tablet computers, phone and tablet combinations or "phablet" computers, thermostats, medical devices, portable meters, gaming devices and controllers, and many others.

The arrangements above describe example applications for a bandwidth estimator used for adjusting the sampling rate of a sampler or ADC to optimize the power consumption. However the methods and circuits above that form arrangements of the present application for bandwidth estimation for an input signal are not restricted to this example application. Additional applications for the bandwidth estimation arrangements include, as further illustrative examples presented without limitation and without limiting the scope of the appended claims, signal classification and identification, e.g., identifying speech signal versus wide-band music, signal detection, e.g., tone versus Gaussian noise, selection of post-selection filter bandwidth for noise suppression, and system performance optimization for control systems.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangements of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A bandwidth estimator for an analog to digital converter, comprising:
   a delta amplitude block configured to determine at least one statistic of absolute change in amplitude of N samples including one of average, maximum and minimum, the N samples received from an analog signal sampler coupled to an analog input signal, where N is a positive integer;
   a delta time block configured to determine at least one statistic of absolute time difference including at least one of average, maximum and minimum between time information of consecutive ones of the N samples;
   a peak voltage block configured to determine a maximum magnitude of the samples in the N samples;
   a peak to root mean square block configured to determine a ratio of the peak voltage to the root mean square of a magnitude of the N samples;

a bandwidth estimation block configured to determine a bandwidth estimate by computing a product of a first ratio of one of the statistics of the amplitude change to one of the statistics of time difference, multiplied by a second ratio computed as the ratio of the peak voltage to the root mean square of the magnitude of the N samples, squared, to the peak voltage multiplied by a constant K; and a parameter adjustment output configured to output parameter input signals to the analog signal sampler to modify a sampling rate of the sampler responsive to the bandwidth estimate.

2. The bandwidth estimator of claim 1, wherein the analog signal sampler is a synchronous sampler and the parameter signals comprise a sampling rate adjustment signal.

3. The bandwidth estimator of claim 1, wherein the analog signal sampler is an asynchronous sampler, and the parameter signals comprise sampler input signals configured to adjust at least one of a polling time interval, a blanking time interval, a snapout value, and a maximum time between consecutive samples.

4. The bandwidth estimator of claim 1, wherein the analog signal sampler is an asynchronous sampler, and the parameter input signals comprise signals to adjust a polling interval time.

5. The bandwidth estimator of claim 1, wherein the bandwidth estimation block further comprises:
   a comparator coupled to the receive the bandwidth estimate and to compare the bandwidth estimate to a predetermined threshold; and
   an adjustment circuit configured to output the parameter signals so as to increase a sampling rate of the analog signal sampler when the bandwidth estimate increases above a threshold, and further configured to adjust the parameter signals so as to decrease the sampling rate of the analog signal sampler when the bandwidth estimate decreases below a threshold.

6. The bandwidth estimator of claim 1, wherein the bandwidth estimation block further comprises:
   a processor configured to execute predetermined instructions to perform the delta amplitude block, delta time block, peak voltage block, peak to root mean square block, and the bandwidth estimator block; and
   the processor further configured to adjust the parameter signals output to the sampler, responsive to the bandwidth estimate determined in the bandwidth estimator block.

7. The bandwidth estimator of claim 6, wherein the processor further comprises a digital signal processor.

8. The bandwidth estimation block of claim 7, wherein the processor further comprises a microprocessor.

9. The bandwidth estimator of claim 1, wherein the bandwidth estimation block further comprises programmable logic devices to implement at least one of the delta amplitude block, delta time block, peak voltage block, peak to root mean square block, and the bandwidth estimator block.

10. The bandwidth estimator of claim 1, wherein the bandwidth estimator is directly coupled to a sampler of an analog to digital converter.

11. The bandwidth estimator of claim 1, wherein the bandwidth estimator is coupled to digital output signals of an analog to digital converter.

12. A method, comprising:
    receiving samples of an analog input signal from a sampling circuit having a parameter adjustment input signal configured to adjust a sampling rate of the sampling circuit;
    storing N samples in a sample buffer;
    computing a bandwidth estimate of the analog input signal by further performing:
       determining an average change in amplitude of N samples, where N is an integer;
       determining a minimum time difference between a time information of the N samples;
       determining a peak voltage by computing a maximum magnitude of the samples in the N samples;
       determining a peak to root mean square ratio by computing the ratio of the peak voltage to the root mean square of a magnitude of the N samples;
       determining a bandwidth estimate by computing a product of a first ratio of the average change in amplitude to the minimum time difference, multiplied by a second ratio computed as the ratio of the peak voltage to the root mean square of a magnitude of the N samples, squared, to the peak voltage multiplied by a constant K; and
    performing a parameter adjustment by adjusting the parameter input signal of the sampling circuit responsive to the bandwidth estimate.

13. The method of claim 12, and further comprising:
    performing the parameter adjustment by adjusting a sampling clock rate to the sampling circuit, the sampling circuit comprising a synchronous sampler circuit.

14. The method of claim 12 and further comprising:
    performing the parameter adjustment by adjusting parameters to the sampling circuit to affect the sampling rate, the sampling circuit comprising an asynchronous sampler circuit.

15. The method of claim 14, wherein adjusting parameters to the sampling circuit further comprises adjusting at least one of the parameters of an asynchronous sampler including at least one of a polling time interval, a blanking time interval, a maximum time between samples, and a snapout value.

16. The method of claim 14, wherein adjusting parameters to the sampler circuit further comprises adjusting a polling time interval of an asynchronous sampler.

17. The method of claim 12, and further comprising performing a reconstruction on the samples to form digital weighting signals corresponding to the samples of the analog input signal, and performing post processing to form digital output signals that represent the analog input signal.

18. The method of claim 12, and further comprising:
    comparing the bandwidth estimate to a predetermined threshold;
    if the bandwidth estimate is greater than a predetermined threshold, adjusting the parameters to increase a sampling rate of the sampler; and
    if the bandwidth estimate is less than a predetermined threshold, adjusting the parameters to decrease the sampling rate of the sampler.

19. An integrated circuit, comprising:
    an analog to digital circuit, comprising: a sampler circuit coupled to an analog input signal and having a parameter input, and configured to output samples of the analog input signal; bandwidth estimator circuit coupled directly to the output of the sampler circuit and configured to output parameters to the parameter input; a reconstruction engine coupled to the output of the sampler circuit and configured to receive samples of the analog input signal and to output digital representations corresponding to the samples; and a post-processing circuit coupled to the reconstruction engine and configured to receive the digital representations and to output digital signals corresponding to the analog input signal;

wherein the bandwidth estimator circuit further comprises:

an amplitude averaging block configured to determine an average change in amplitude of N samples, where N is an integer;

a delta time block configured to determine a minimum time difference between a time information of the N samples;

a peak voltage block configured to determine a maximum magnitude of the samples in the N samples;

a peak to root mean square block configured to determine a ratio of the peak voltage to the root mean square of a magnitude of the N samples; and a bandwidth estimator block configured to determine a bandwidth estimate that is a product of a first ratio of the average change in amplitude to the minimum time difference, multiplied by a second ratio computed as the ratio of the peak voltage to the root mean square of the magnitude of the N samples, squared, to the peak voltage multiplied by a constant K.

20. The integrated circuit of claim 19, wherein the bandwidth estimator circuit further comprises:

a processor configured to execute predetermined instructions to provide the amplitude averaging block, delta time block, peak voltage block, peak to root mean square block, and the bandwidth estimator block; and the processor further configured to adjust the parameter signals output to the sampler circuit responsive to the bandwidth estimate determined in the bandwidth estimator block.

21. The integrated circuit of claim 20, and further comprising:

a sensor for sensing a condition and outputting analog signals to the analog to data converter;

memory for storing data; and a processor for performing user specified functions in response to a change in the condition;

wherein the integrated circuit forms a system on a chip.

* * * * *